US007626869B2

(12) United States Patent
Wang et al.

(10) Patent No.: US 7,626,869 B2
(45) Date of Patent: Dec. 1, 2009

(54) MULTI-PHASE WORDLINE ERASING FOR FLASH MEMORY

(75) Inventors: Xuguang Wang, Sunnyvale, CA (US); Yi He, Fremont, CA (US); Zhizheng Liu, San Jose, CA (US); Sung-Yong Chung, Santa Clara, CA (US); Darlene G. Hamilton, White Salmon, WA (US); Ashot Melik-Martirosian, Sunnyvale, CA (US); Gulzar Kathawala, Santa Clara, CA (US); Ming Sang Kwan, San Leandro, CA (US); Mark Randolph, San Jose, CA (US); Timothy Thurgate, Sunnyvale, CA (US)

(73) Assignee: Spansion LLC, Sunnyvale, CA (US)

( * ) Notice: Subject to any disclaimer, the term of this patent is extended or adjusted under 35 U.S.C. 154(b) by 206 days.

(21) Appl. No.: 11/745,327

(22) Filed: May 7, 2007

(65) Prior Publication Data
US 2008/0279014 A1 Nov. 13, 2008

(51) Int. Cl.
*G11C 11/34* (2006.01)
(52) U.S. Cl. ............................ 365/185.29; 365/185.24
(58) Field of Classification Search ............ 365/185.29, 365/185.24
See application file for complete search history.

(56) References Cited

U.S. PATENT DOCUMENTS

| | | | |
|---|---|---|---|
| 6,295,227 B1 * | 9/2001 | Sakui et al. ............ 365/185.17 |
| 6,301,150 B1 * | 10/2001 | Kanamitsu et al. ...... 365/185.03 |
| 6,728,146 B1 * | 4/2004 | Li et al. ..................... 365/200 |
| 6,954,765 B2 * | 10/2005 | Spiegel ....................... 707/200 |
| 7,155,357 B2 * | 12/2006 | Hollmer ....................... 702/82 |
| 2004/0073582 A1 * | 4/2004 | Spiegel ....................... 707/204 |
| 2005/0154818 A1 * | 7/2005 | Chen ........................... 711/103 |
| 2007/0101184 A1 * | 5/2007 | Norman et al. ................ 714/5 |

* cited by examiner

*Primary Examiner*—Michael T Tran
(74) *Attorney, Agent, or Firm*—Turocy & Watson, LLP

(57) ABSTRACT

Erasing wordlines at the same time can cause undesirable results because some wordlines are affected by electromagnetic waves of other wordlines. However, other wordlines are not affected because they are next to contacts. Therefore, it can be beneficial to erase wordlines in a multi-phase sequence that allows for erasing wordlines without an impact from other wordlines.

20 Claims, 19 Drawing Sheets

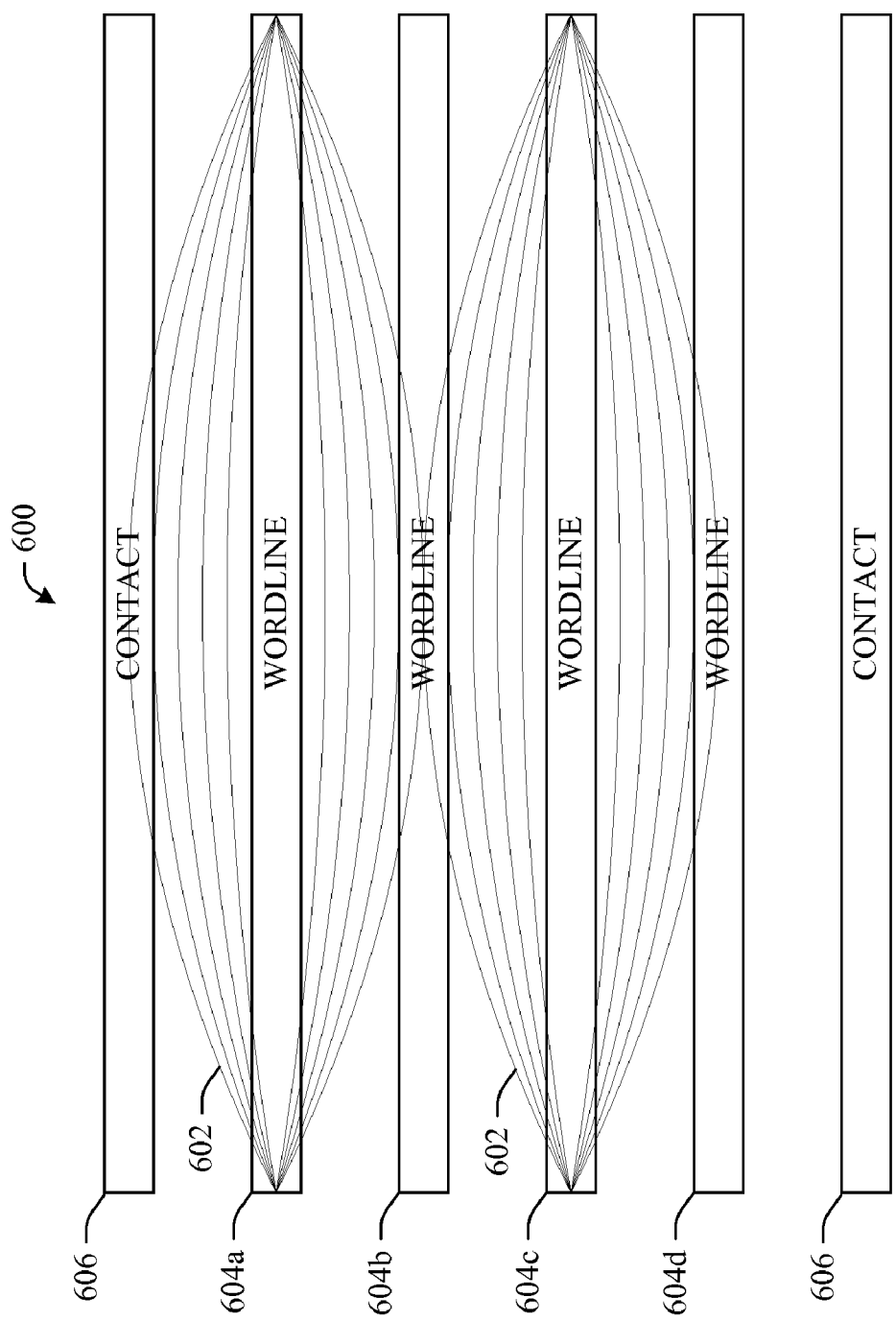

MULTI-PHASE WORDLINE ERASING FOR FLASH MEMORY

TECHNICAL FIELD

The subject specification relates generally to memory devices and in particular to erasing wordlines for dual bit flash memory cells.

BACKGROUND

One area of recent advancement is the development of different memory types, each with different characteristics. An important aspect of a majority of electronic devices is the ability to store information in digital memory, which stores information as a series of I/Os. Digital memory is a broad category with many different types of subset memory. One memory type is read-only memory (ROM). ROM is a non-volatile memory type that a system can write to only once. Non-volatile memory can retain information without a constant source of power. The system can read the information stored in the memory, but it cannot re-write new information to the memory. Oftentimes, memory writing takes place during the manufacturing process, thus many times a consumer never writes to ROM memory.

One of the most common and important types of memory in an electronic device is random access memory (RAM), which is memory that allows information to be read in any order regardless of its stored sequence. RAM is the main working area for most computer systems, such as personal computers. Electronic devices can read the information stored in RAM and they can write new information to RAM. One major flaw with RAM is that most types are volatile memory types, meaning that they need to draw from a constant source of power to retain their memory.

The most common form of RAM is dynamic random access memory (DRAM). In an integrated circuit, each bit of data is stored in an individual capacitor as an I/O. The capacitors lose voltage due to natural leakage and stored data is lost unless the system recharges the capacitor. The addition of the term dynamic is because a constant activity is taking place (e.g., the constant recharging of a capacitor). There are several variations on DRAM, such as a video DRAM. There are other types of RAM, such as static random access memory, but they are less common then DRAM.

Other memory types exist to alleviate the problems present in ROM and RAM. One of the basic memory types created for alleviating these flaws is Electrically Erasable Programmable Read Only Memory (EEPROM), which is both non-volatile and capable of multiple writes and reads. However, EEPROM is rather expensive to manufacture, thus making it impractical for most personal applications. Flash memory technology is an alternative to EEPROM. In addition to being readable, re-writable (e.g., erased and written to again), and non-volatile, flash memory is relatively cheap to mass-produce. The economic factor makes flash memory much more appropriate for personal applications, such as storing of digital photographs and storing digital music files. Flash memory devices generally have a guaranteed life span of about one million programming cycles. Information in flash memory devices is stored on wordlines and bitline. To erase the information, a voltage is applied that erases stored information.

SUMMARY

The following presents a simplified summary of the specification in order to provide a basic understanding of some aspects of the specification. This summary is not an extensive overview of the specification. It is intended to neither identify key or critical elements of the specification nor delineate the scope of the specification. Its sole purpose is to present some concepts of the specification in a simplified form as a prelude to the more detailed description that is presented later.

The subject specification relates to erasing wordlines in a dual bit flash memory cell. In traditional flash memory cells, a plurality of wordlines rest next to each other in wordline sets and contacts rest between wordline sets. In standard practice, wordlines are erased at the same time by applying a voltage to all wordlines that need erasing. A voltage application on a wordline creates an electromagnetic field around the wordline. As the distances between wordlines become smaller (e.g., below about 65 nanometers), these electromagnetic fields are affecting erase speeds of neighboring wordlines. Contact still has positive voltage but it is much farther away from the first word line and the effect is negligible on nearby wordlines. Therefore, if all wordlines are erased at the same time, then different wordlines have different erase speeds because some are next to wordlines (e.g., impacted by neighboring fields) and others are next to contact (e.g., not neighboring field).

The subject specification approaches erasing memory in a different manner. The wordlines are erased in a multi-stage sequence and not all at once. For example, erasing all odd numbered wordlines first and then erasing all even numbered wordlines. This allows for enough space so that the electromagnetic fields do not pass over wordlines that are erasing. Using multi-stage sequences enables greater erasing uniformity and overall improved performance.

The following description and the annexed drawings set forth certain illustrative aspects of the specification. These aspects are indicative, however, of but a few of the various ways in which the principles of the specification may be employed. Other advantages and novel features of the specification will become apparent from the following detailed description of the specification when considered in conjunction with the drawings.

BRIEF DESCRIPTION OF THE DRAWINGS

FIG. 6a illustrates a first phase of a representative wordline and contact configuration with appropriate electromagnetic fields in accordance with an aspect of the subject specification.

DETAILED DESCRIPTION

Figure 1:
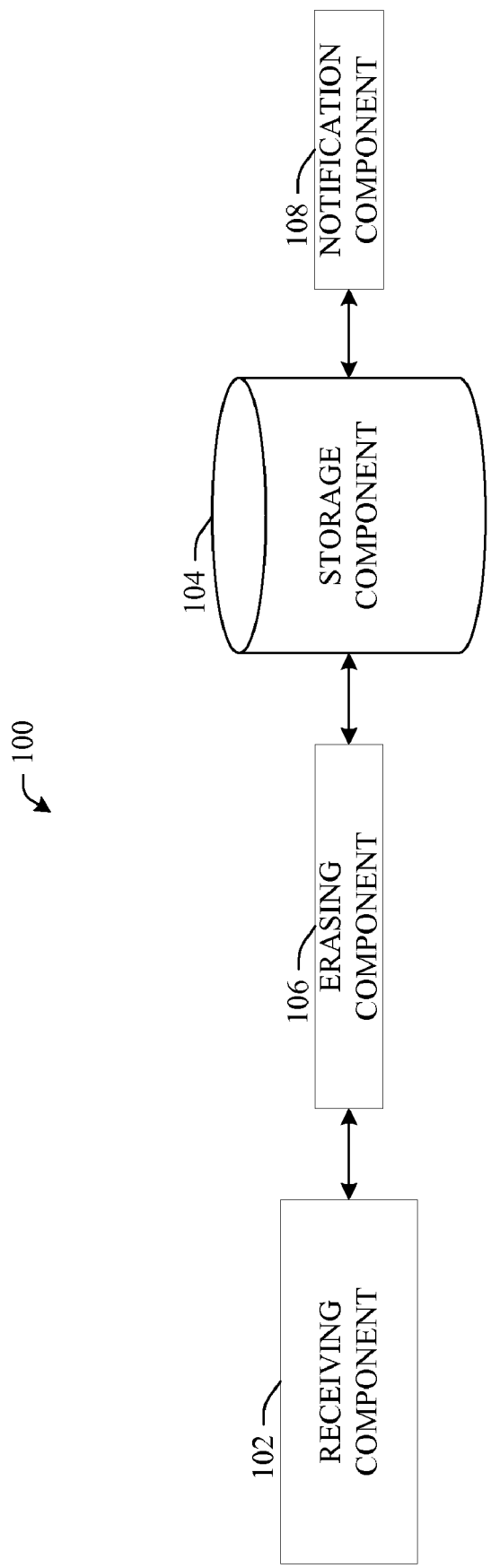
FIG. 1 illustrates a representative flash memory device in accordance with an aspect of the subject specification.

The claimed subject matter is now described with reference to the drawings, wherein like reference numerals are used to refer to like elements throughout. In the following description, for purposes of explanation, numerous specific details are set forth in order to provide a thorough understanding of the claimed subject matter. It may be evident, however, that the claimed subject matter may be practiced without these specific details. In other instances, well-known structures and devices are shown in block diagram form in order to facilitate describing the claimed subject matter.

As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

FIG. 1 disclosed an example flash memory device 100 with several features in accordance with the subject specification. The receiving component 102 receiving a command to delete information stored in a storage component 104. Commonly, this command is from an electronic device, such as a cellular telephone or personal digital assistant. In one embodiment of the subject specification, the receiving component 102 physically connects to the electronic device. This connection can take place through an I/O port, since much of the information traveling into a flash memory device 100 is in digital format. The flash memory device can be equipped with a Universal Serial Bus (USB) extension that connected into a USB port. In another embodiment, the receiving component 102 connects with an electronic device through wireless connection. The receiving component 102 instructs an erasing component 106 to erase information in the storage component 104 based on the command.

The erasing component 106 can erase information stored on a storage component 104. Information relating to the erasing typically comes from both an erasing command received by the receiving component 102 and for memory located within the erasing component 106. For example, specific information that is to be deleted likely comes from the command received by the receiving component 102. However, the amount of current to be applied to the wordlines during the erasing is commonly stored in memory of the erasing component 106.

Not all wordlines are erased at the same time. A variety of sequences can be applied to erase the wordlines. The erasing component 106 can determine an appropriate sequence for erasing wordlines. For example, odd numbered wordlines can be erased first. Once odd numbered wordlines are erased, even numbered wordlines are erased. In another example, wordlines are erased by fourths (e.g., 1, 5, 9, 13, then 2, 6, 10, 14, and so on for a sixteen-wordline set). In one embodiment of the subject specification, the erasing sequence is stored in memory in the erasing component 106.

The storage component 104 commonly contains a plurality of memory banks that hold information. Usually, the storage component 104 is arranged as a memory array. A plurality of wordlines and bitlines make up the memory array, organized in a plurality of banks. In order to erase a wordline, there is an application of current, commonly performed through the erasing component 106. In addition to having the wordlines erased, the storage component 104 has its bitlines erased by the erasing component 106. The storage component 104 can be erased in full or it can be partially erased (e.g., only some wordlines and bitlines are erased while other wordlines and bitlines remain intact).

The notification component 108 sends out a notification containing a plurality of information about erasing procedure. For example, it can send out information that the erasing was successfully completed and/or it can send out diagnostic information (e.g., how long the erasing took or how much current was used by during erasing). The notification component 108 can communicate information to a variety of locations. For example, notification can travel to an external device (e.g., a personal computer or network server) or to a diagnostic component located within the flash memory device 100. When communicating with an external device, the notification component 108 can communicate through a physical or a wireless connection. In one embodiment, the notification component 108 and receiving component 102 integrate together and communicate with the same device.

Figure 2:
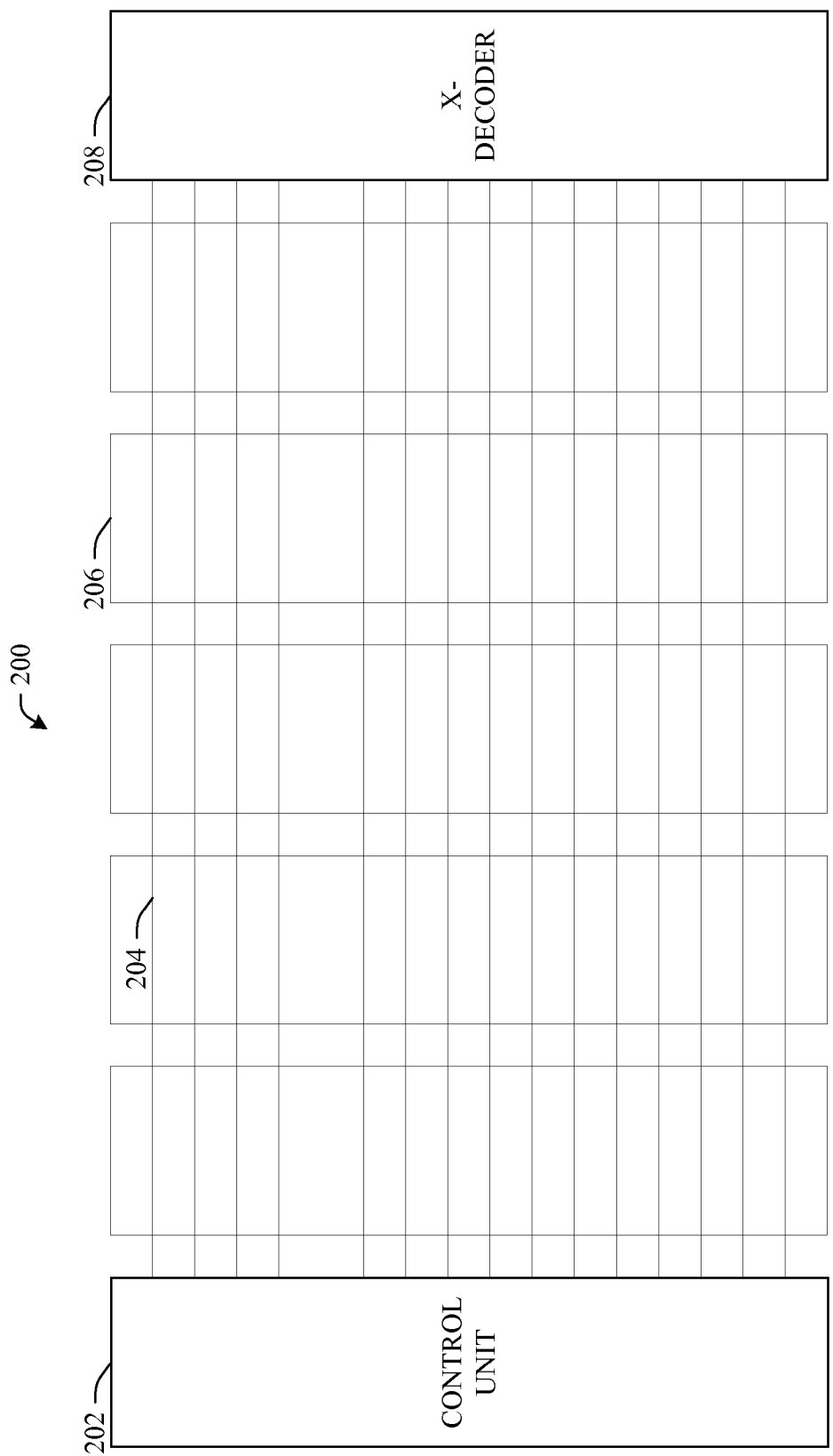
FIG. 2 illustrates a representative memory array with related devices in accordance with an aspect of the subject specification.

FIG. 2 is an example memory array 200 with related units. The memory array 200 is commonly at least part of the storage component 104 of FIG. 1. A control unit 202 can function to erase information stored along wordlines 204; this control unit could integrate with the erasing component 106 of FIG. 1. The wordlines 204 configure across at least one bank 206 of the memory array 200. In the drawing, sixteen wordlines 204 are shown; however, various numbers of wordlines 204 can be present in a memory array 200. An X-decoder 208 functions during reading of information stored on wordlines 204. During erasing wordlines 204, it does not function in normal capacity since the information is being erased and is not being read. However, the X-decoder 208 can function as part of the notification component 108 in FIG. 1. For example, the X-decoder 208 can be configured to receive current that passes through the wordlines and when the current reaches the X-decoder 208, it means any erasing is complete. Therefore, the X-decoder 208 functions as a sensing unit for a flash memory device.

Five banks 206 are shown making up the memory array 200. Various numbers of banks 206 can make up a memory array 200, including only one bank 206. In one embodiment of the subject specification, only some wordlines 204 are erased during an erasing procedure. For example, there can be an erase command requiring the erasing of only the bottom eight wordlines 204. The control unit 202 erases only the bottom wordlines 204 as required and leaves the top eight wordlines 204 intact. While not shown, there are commonly bitlines running perpendicular to the wordlines across each memory bank 206.

Figure 3:
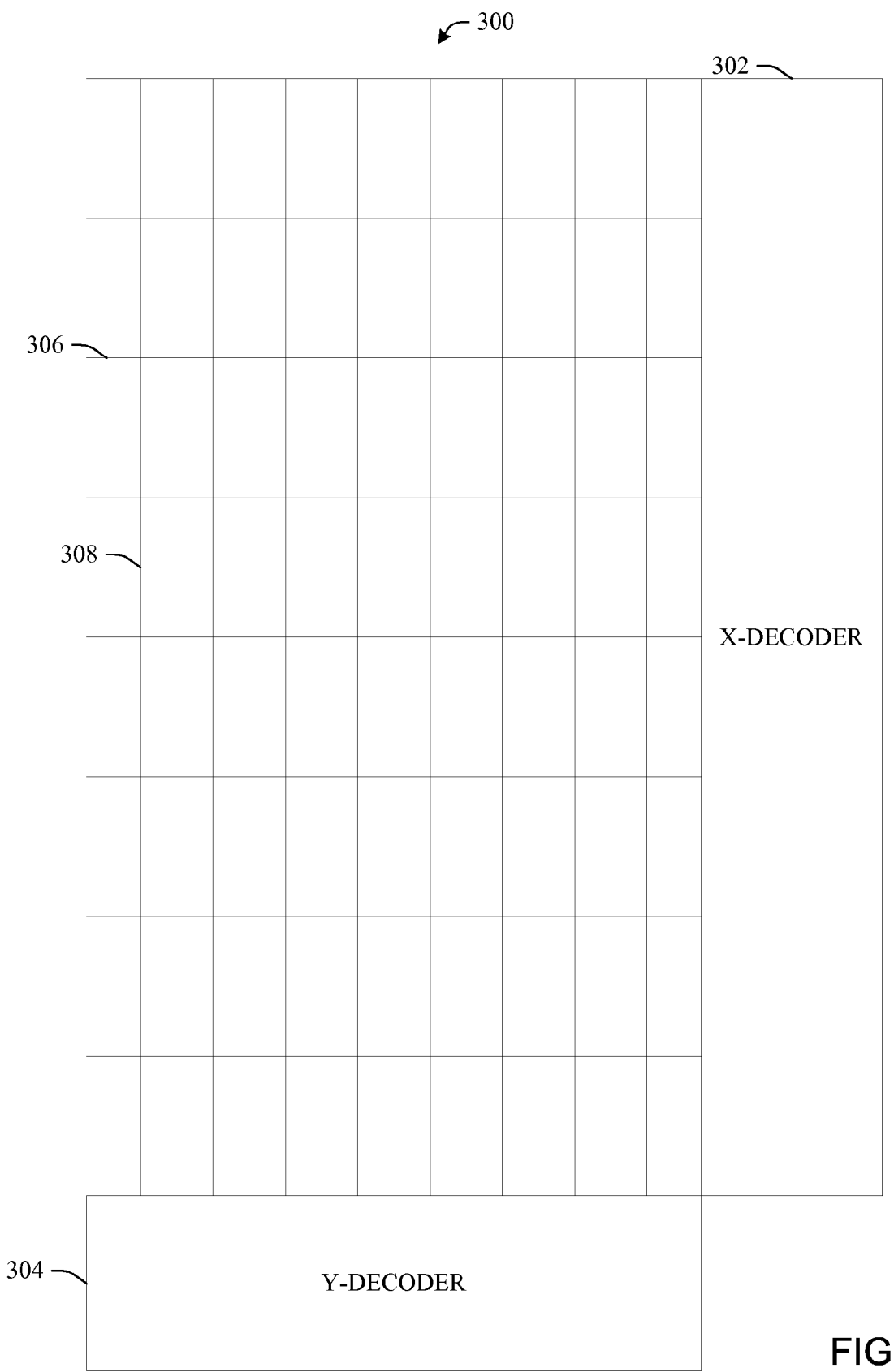
FIG. 3 illustrates a representative memory array bank with related devices in accordance with an aspect of the subject specification.

FIG. 3 discloses a single bank memory array 300 with both an X-decoder 302 and a Y-decoder 304. A common memory array bank 300 has a plurality of both wordlines 306 and bitlines 308. In common erasing, voltage and current are applied to the wordlines 306 and bitlines 308 that are to be erased. However, in most cases, only a limited amount of lines can be erased at a single time due to limitation of resources within a flash memory device. Therefore, there is no change in the total amount of line that can be erased in a method that alternates the wordlines 306 since bitlines 308 can also be erased. Both the X-decoder 302 and the Y-decoder 304 can function as sensing units that determines when erasing completes.

For example, in FIG. 3 there are eight wordlines 306 and eight bitlines 308. A flash memory device can only have the capability of erasing eight lines at any given time. Therefore, if every other wordline 306 is erased (e.g., one, 3, 5, and 7), then four bitlines 308 can be erased at the same time (e.g., 1, 2, 3, and 4) making a total of eight lines. Once complete, the other wordlines 306 (e.g., 2, 4, 6, and 8) and bitlines 308 (e.g., 5, 6, 7, and 8) can be erased. Non-uniform erasing can take place, meaning that two wordlines 306 can be erased while six bitlines 308 are erased.

A problem that occurs during the erasing of wordlines 306 and bitlines 308 is the idea of current crowding. When all the wordlines 306 have a voltage and a current applied to them, there is current crowding at the wordline center of the memory bank 300 and thus at the center of an overall memory array. The reason for this is that there is less area for current to escape at the center since there is no edge as opposed to the ends where there is area for escape since there is no current toward one side. This leads to two major problems: it takes a longer time to erase the memory array and higher current amounts toward the center of the array lead to a quicker breakdown of the memory array in the center area. Employing a system where not every wordline 306 is erased allows for enough room so the current can escape though gaps left by the wordlines 306 not erased at that time. Using an alternating erasing sequence allows for the diminishment of the effects of current crowding.

Figure 4:
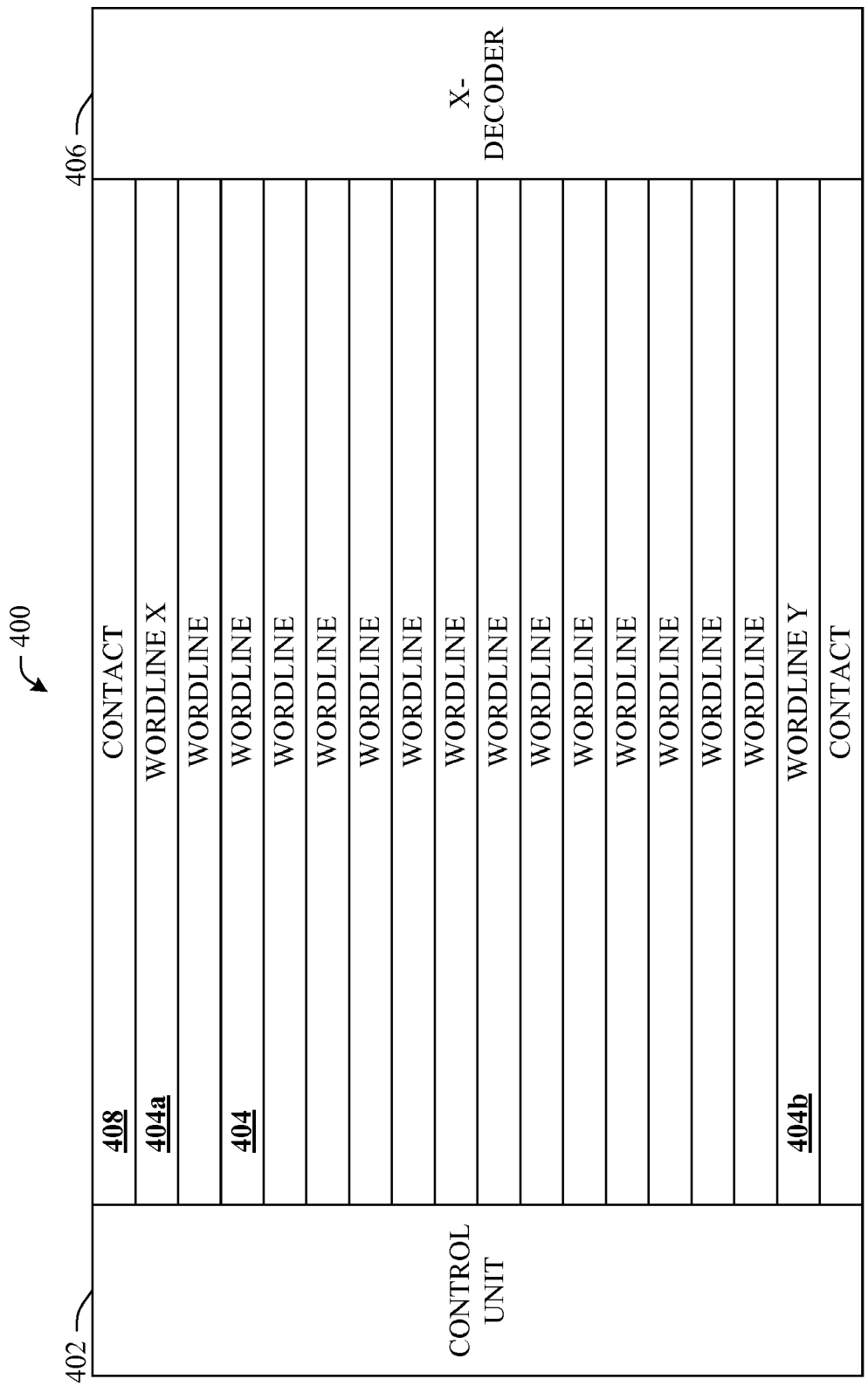
FIG. 4 illustrates a representative wordline configuration with related devices in accordance with an aspect of the subject specification.

FIG. 4 discloses an example wordline configuration 400 in accordance with the subject specification. A control unit 402 applies a voltage to a wordline 404 in order to erase the stored contents of the wordline 404. Since the wordlines 404 have resistance, the voltage application creates a current that travels down the wordlines 404 to an X-decoder 406. The X-decoder 406 operates as a sensor to determine when there erasing of the wordlines 404 has been completed.

In FIG. 4, all but two of the wordlines 404 are considered the same. However, there are two wordlines 404 with special considerations: wordline X 404a and wordline Y 404b. The reason these wordlines are treated differently then the other wordlines is because they are next to contact 408 (NTC). Contacts 408 do not function as wordlines 404 and have positive potential applied to them as opposed to negative potential being applied on the wordlines. In addition, the contacts are placed farther apart from the NTC wordlines as compared to the spacing between two neighboring wordlines. This leads to an irregularity when erasing wordlines 404 that are spaced very close together.

Specifically when wordlines 404 are separated by less then about 65 nanometers (nm), the wordlines 404 become affected by the erasing of neighboring wordlines 404. When voltage is applied to a wordline 404, an electromagnetic field emits from the wordline 404. At distances of less then about 65 nm, wordlines 404 are impacted by electromagnetic fields of neighboring wordlines 404. However, wordlines 404a, 404b that border contacts will not be impacted by equal electromagnetic fields as non-NTC wordlines 404 because contacts do not produce sufficiently strong electromagnetic fields to impact wordline X and wordline Y.

The electromagnetic fields give a non-uniform erase time overall, because wordlines X and Y 404a, 404b do not have a benefit from two neighboring wordlines 404 because they are NTC, so they only gain the benefit from one neighboring wordline 404. While the drawing shows only one set of sixteen wordlines 404 and appropriate contacts 408, there could be a number of wordline sets arranged in parallel. Commonly, there is one contact 408 for every wordline set as well as a start contact 408 for an entire memory array. In addition, while a contact 408 is shown for every sixteen wordlines 404, there can be contacts 408 between any number of wordlines 404. Many wordline-contact combinations are arranged of sets of $2^n$.

Figure 5:
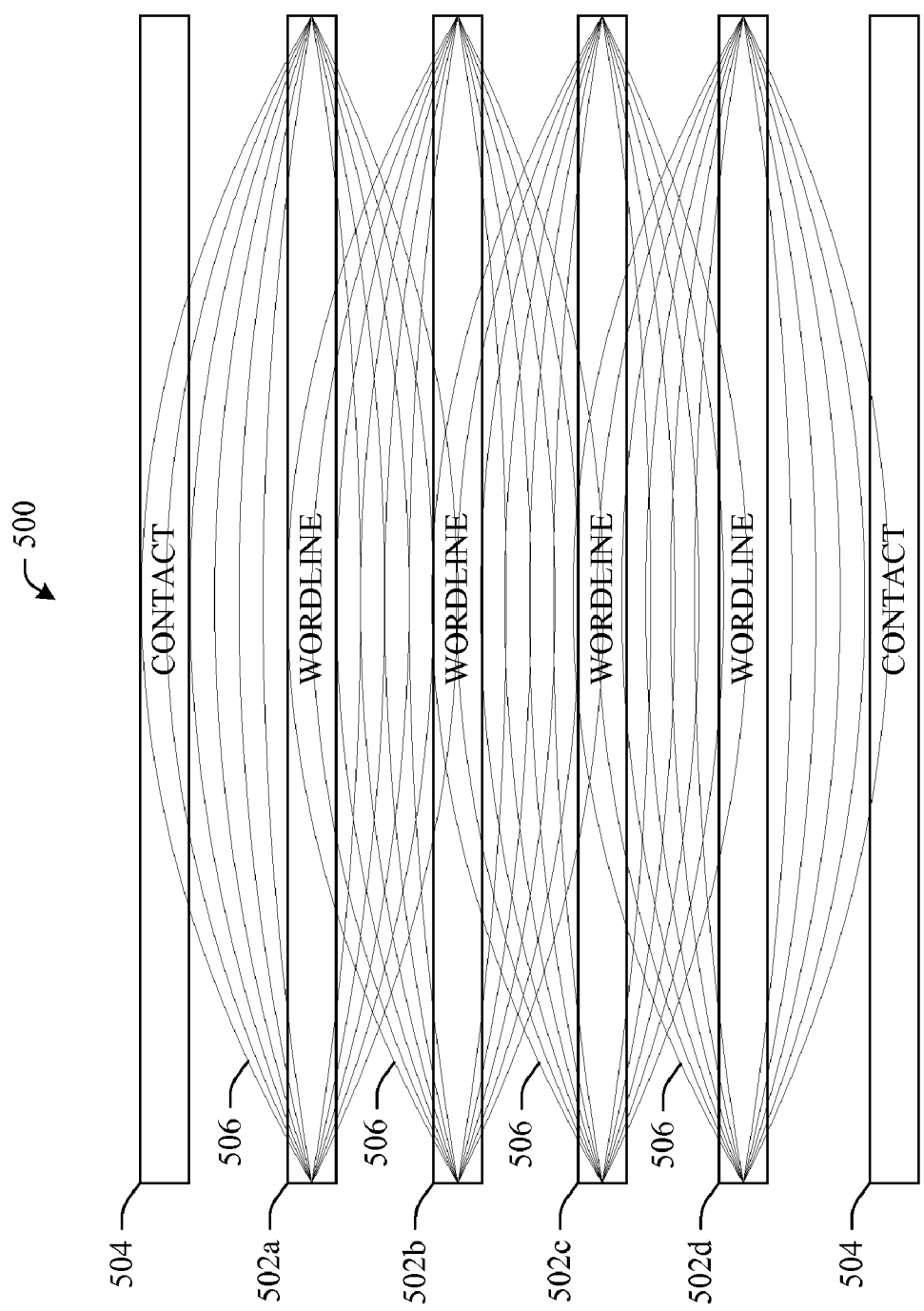
FIG. 5 illustrates a representative wordline and contact configuration with appropriate electromagnetic fields in accordance with an aspect of the subject specification.

FIG. 5 discloses an example wordline set 500. Four wordlines 502a-d are arrange in parallel in a memory array of a flash memory device and contacts 504 are placed at top and bottom of the wordline set 502. A typical flash memory device has contacts 504 placed in a memory array, commonly at equal increments. In standard operation, there is the same distance between each wordline 502. However, other configurations can practice the subject specification wherein the distances are not uniform. For example, the subject specification can practice with slight, natural variations between the distances due to manufacturing imperfections (e.g., distance between 502a and 502b is about 64 nm, while the distance between 502b and 502c is about 63.3 nm). In addition, the subject specification can practice when there is an intentional disparity in distances between wordlines (e.g., distance between 502a and 502b is about 70 nm, while the distance between 502b and 502c is about 50 nm). Furthermore, there are numerous other configurations that allow for the practice of the subject specification. In addition to wordlines 502, there are contacts 504 incrementally placed throughout the flash memory array.

When a common flash memory device erases four wordlines 502 at the same time, each wordline 502 exerts an electromagnetic field 506. The electromagnetic fields 506 generate from the application of voltage on the wordlines 502. A field 506 generated by a single wordline 502 can influence other neighboring wordlines 502 if the wordlines 502 are close enough together. The application of non-related electromagnetic fields 506 (e.g., fields that are not generated by the wordline) increases the speed in which wordlines 502 erase. However, NTC wordlines 502a, 502d do not have the same impacts as wordlines 502b, 502c that are not NTC. This is because a contact 504 does not commonly exert an electromagnetic field equal to a field generated by a wordline 502.

FIG. 6a discloses an example wordline configuration with appropriate electromagnetic fields 602 according to a first phase of one aspect of the subject specification. Four wordlines 604a-604d are shown with each wordline 604 separated by a distance between about 65 nm to about 35 nm. When a voltage is applied to a wordline 604 an electromagnetic field 602 emits that can affect erase speeds of other wordlines 604. Wordlines 604a and 604d border a contact 606 that does not commonly emit an electromagnetic field 602. In this drawing, two wordlines 604a, 604c are erased at the same time. This allows the wordlines to erase without having an effect from other electromagnetic fields.

Erasing two wordlines as opposed to four wordlines allows for each erasing wordline 604a, 604c to not be impacted by an electromagnetic field 602 emitted by another erasing wordline. By not erasing certain wordlines 604b, 604d, distance between erasing wordlines is increased, commonly beyond 65 nm where erasing wordlines 604a, 604c are not impacted by related wordlines 604b, 604d.

Figure 6B:
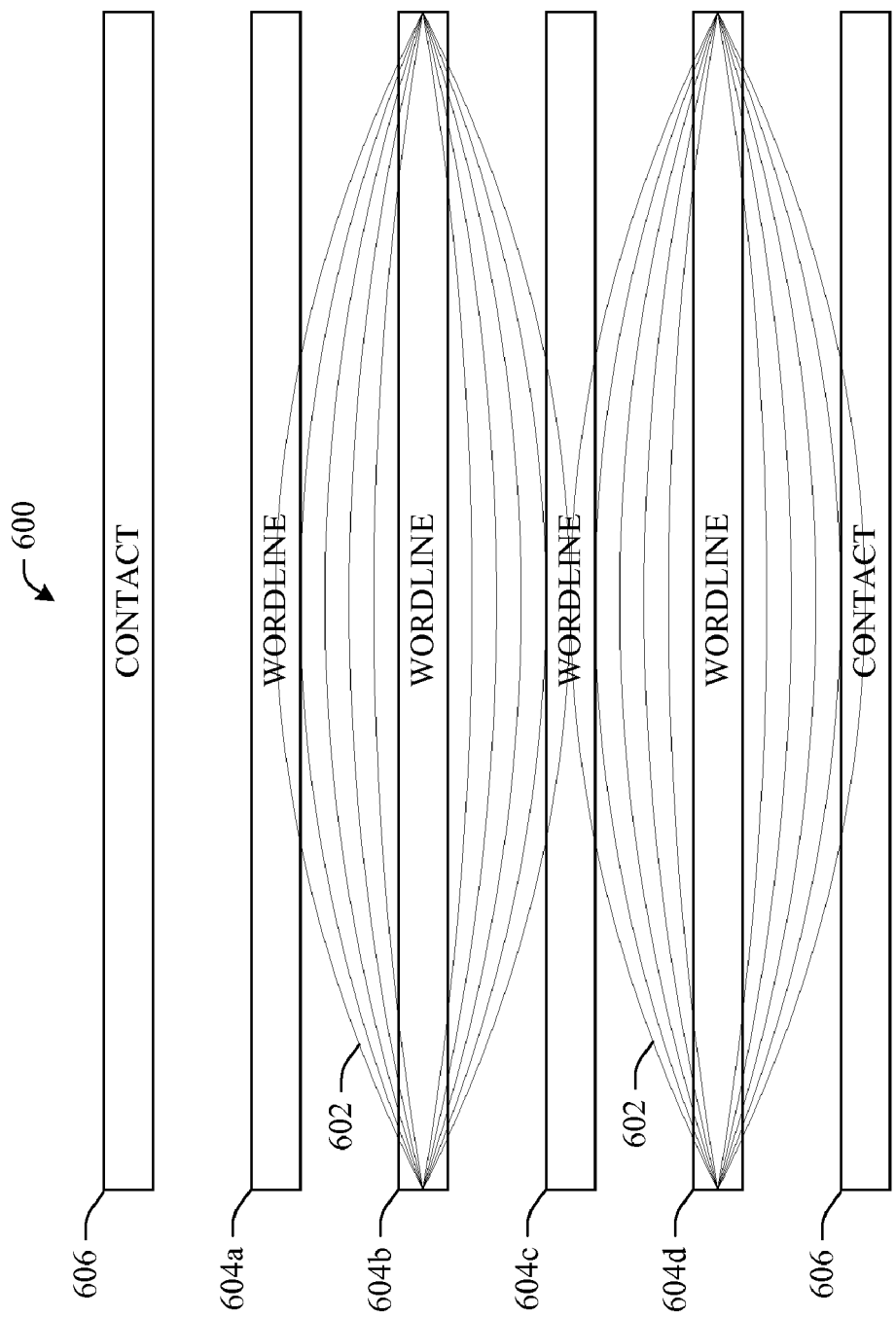
FIG. 6b illustrates a second phase of a representative wordline and contact configuration with appropriate electromagnetic fields in accordance with an aspect of the subject specification.

FIG. 6b discloses an example wordline 604 configuration with appropriate electromagnetic fields 602 according to a second phase of one aspect of the subject specification. The general configuration of FIG. 6b is the same as FIG. 6a. However, different wordlines 604 have voltage applied and thus different wordlines 604b, 604d emit electromagnetic fields 602. This allows erasing wordlines 604b, 604d to erase information without impact from electromagnetic fields 602 of neighboring wordlines 604a, 604c.

The combination of two phases shown in FIG. 6a and FIG. 6b allows for wordline erasing without an impact from neighboring wordlines. This increases the uniformity of wordline erasing and allows for better distribution. The drawings show only four wordlines, however any number of wordlines can operate in accordance with the subject specification. In common operation, wordlines between contacts arrange as sets of $2^n$ (e.g., two, four, eight, sixteen, etc.). One reason for this arrangement is that digital information is commonly stored and organized as sets of $2^n$. In addition, while two stages are shown, there can be any number of stages implemented in accordance with the subject specification.

Figure 7:
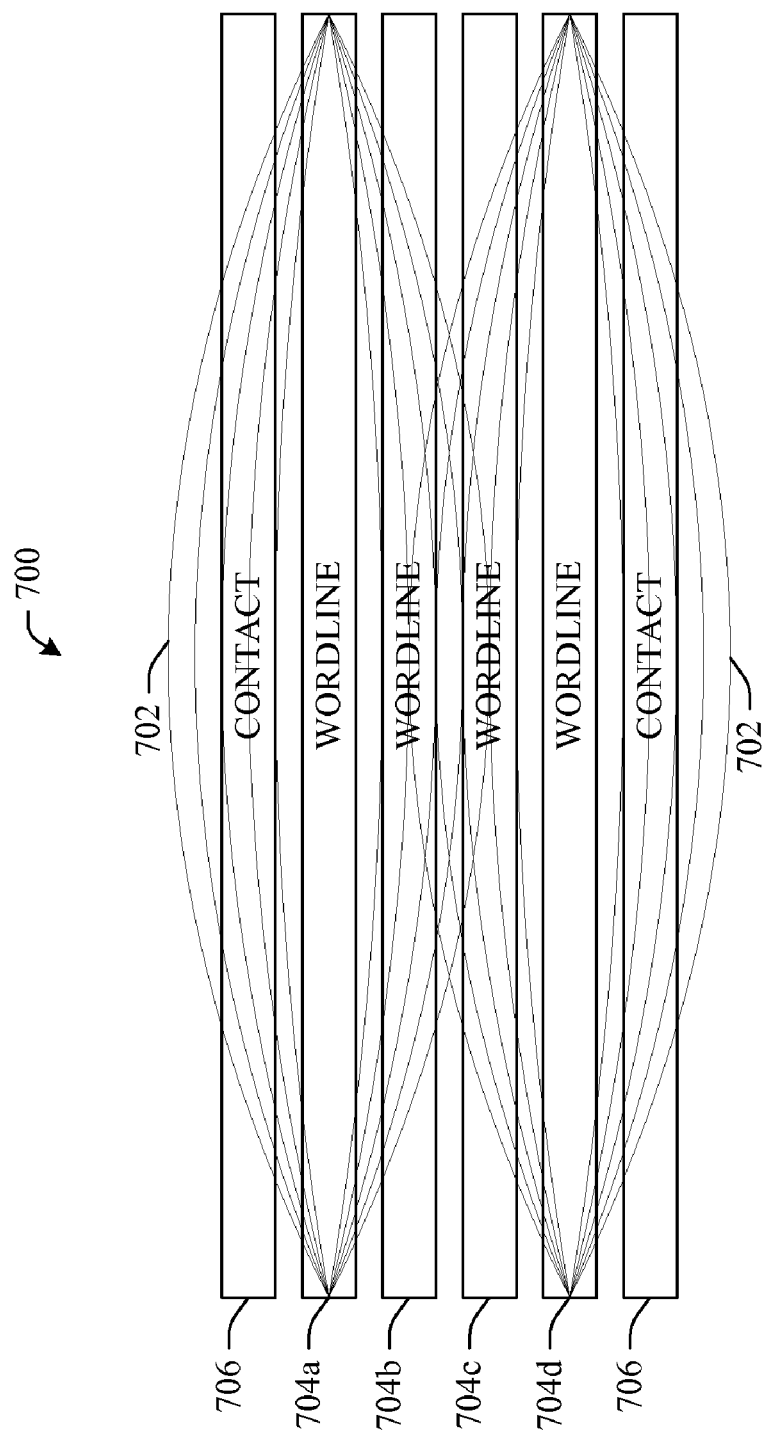
FIG. 7 illustrates a first phase of a representative wordline and contact configuration with appropriate electromagnetic fields in accordance with an aspect of the subject specification.

FIG. 7 discloses an example wordline configuration with appropriate electromagnetic 702 fields according to one aspect of the subject specification. There are possible situations where spaces between wordlines 704 are less then about 32.5 nm. When spaces are smaller then about 32.5 nm, wordlines are commonly impacted by directly neighboring wordlines, but also by wordlines that are more distant. For example, wordline 704a would be impacted not only by an electromagnetic field 702 of wordline 704b, but also of an electromagnetic field 702 of wordline 704c. Therefore, there can be a sequence that allows different wordlines to erase depending on the distance.

For example, a memory array configures with four wordlines 704a-d and two contacts 706. The wordlines are spaced together closer then about 32.5 nm. A sequence takes place that erases wordline 704a and 704d so electromagnetic fields 702 do not affect erasing wordlines 704a, 704d. Erasing of wordlines 704b and 704c can take place in a number of different manners. In one embodiment, there can be a three-phase sequence, meaning wordline 70b erases and then wordline 704c erases. In another embodiment, both wordline 704b and wordline 704c erase at the same time. This can take place even though wordlines will be impacted by one another. There is no requirement that the wordlines be erased in a sequence that allows for minimal or no impact.

Figure 8:
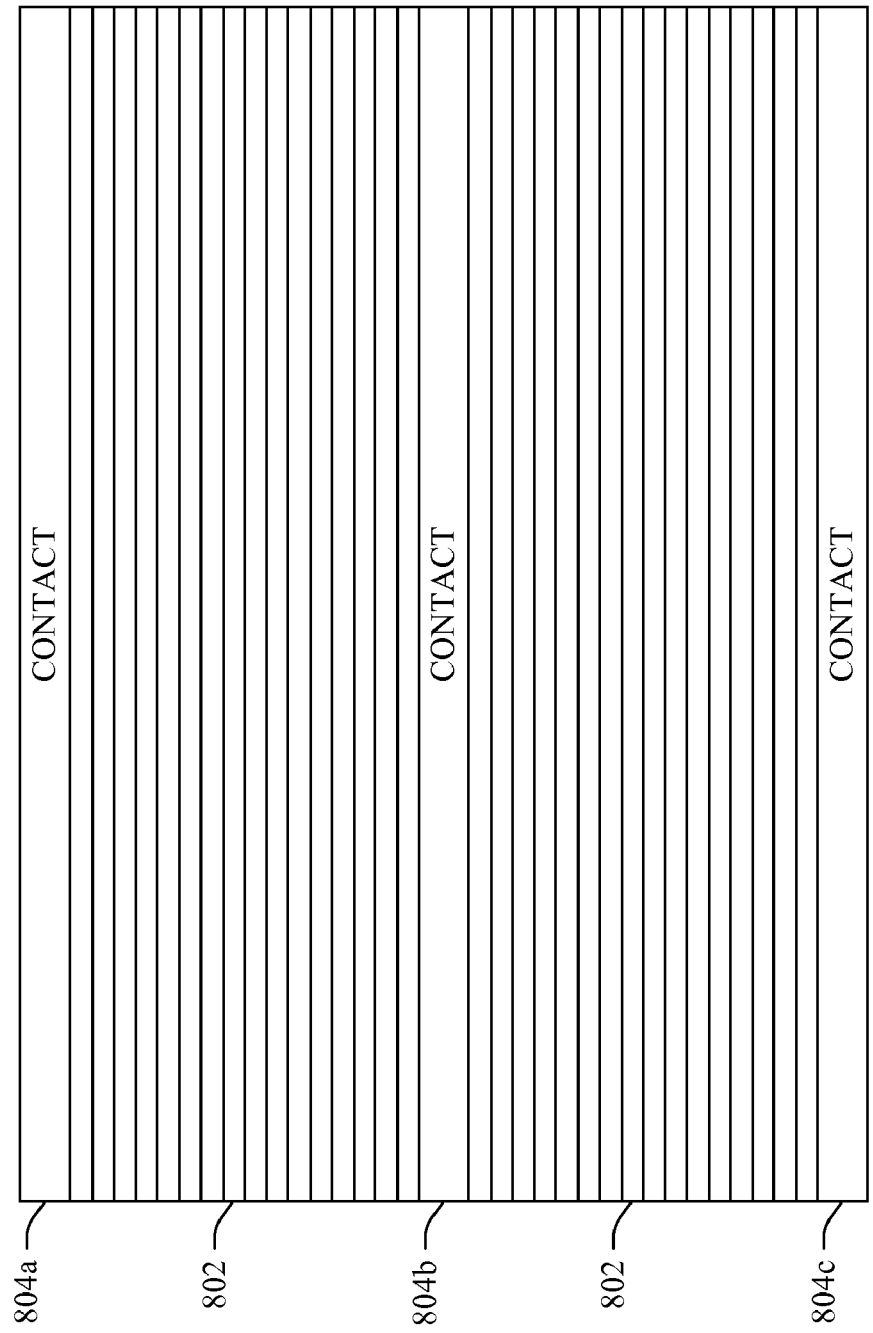
FIG. 8 illustrates a representative wordline and contact configuration accordance with an aspect of the subject specification.

FIG. 8 discloses an example memory bank 800 in accordance with the subject specification. There are a plurality of wordlines sets 802 that are separated by contacts 804. These contacts 804 appear after every sixteenth wordline. However, contacts 804 can appear between any number of wordlines (e.g., every third wordline) and can appear at uneven increments (e.g., a contact appears before any wordlines, then after a wordlines 1-8 and then appears after wordlines 9-12).

This drawing shows that when contacts 804 are placed around wordline sets 802, there can be several different effects on the wordlines if all wordlines are erased at the same time. For example, wordlines in the wordline sets 802 can separate by 8 nm each. Wordlines near contact 804a are impacted by neighboring wordlines below, but there is less impact from above since there are no wordlines above contact 804a. The closer a wordline is to contact 804a, the less influence the wordline feels since there are less wordlines above.

Wordlines centrally located in the wordline sets 802 receive influence roughly equally from both above and below because they are distant from contacts. Wordlines near contact 804b are impacted in generally the same manner as centrally located wordlines, except there is a slight lack of influence because there is no wordline in the space of contact 804b. Wordlines near contact 804c are influenced in the same manner as wordlines near contact 804a since these wordlines feel less of an impact from an absence of wordlines below. This demonstrates the usefulness of a sequence of erasing wordlines that attempts to have wordlines erased in a manner that limits impact by neighboring wordlines. Using an appropriate sequence, there are not differently impacted wordlines. This allows for better uniformity and faster erases.

Figure 9:
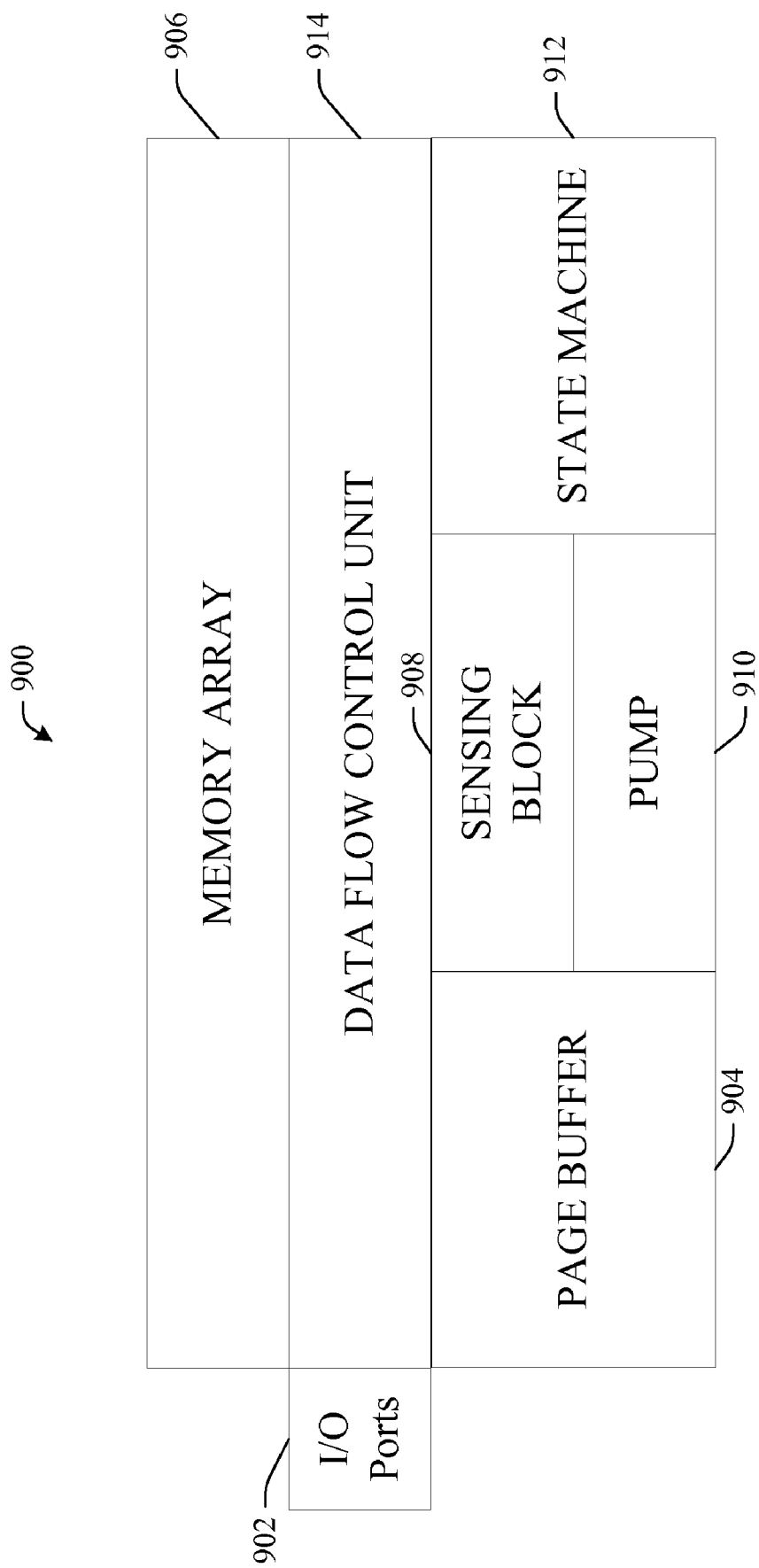
FIG. 9 illustrates a flash memory device in accordance with an aspect of the subject specification.

FIG. 9 discloses an example flash memory device 900 in accordance with the subject specification. A common flash memory device 900 has I/O ports 902 that connect to a host system (e.g., a personal digital assistant or cellular telephone). The I/O port 902 communicates with the host system digitally where an I (e.g., high) or an O (e.g., low) represent all data. In addition, the I/O port 902 can configure to be a conduit to power the flash memory device. This I/O port 902 can have various configurations, including a USB port or individual metal prongs. Many components disclosed in the subject specification can integrate with the I/O port 902. For example, the I/O port 902 can function as the receiving component 102 in FIG. 1. In another example, the I/O port 902 functions as the notification component 108 in FIG. 1.

A page buffer 904 is a temporary holding place for information, which can be used in both writing information to a memory array 906 or retrieving information from the memory array 906. A typical page buffer 904 employs static random access memory (SRAM). In many flash memory devices 900, there is more then one page buffer 904. A memory array 906 is the storage location for a flash memory device 900, and this is the common location of a storage component, for example the storage component 104 in FIG. 1. Typically, a memory array 906 comprises a number of individual cells that can contain information in bits, with typical cells holding one to four bits for information. This memory array can be configured as shown in 200 and 300 in FIG. 2 and FIG. 3 respectively.

A sensing block 908 functions to monitor operations within the flash memory device 900. For example, a sensing block 908 can conclude when a page buffer 904 is open before information is sent to that buffer 904. A pump 910 provides a high voltage for operations that require a higher voltage then normally used in other applications. For example, common erasing functions require a relatively high level of voltage for proper operation. This voltage is applied to wordlines that create magnetic fields that can be seen in FIGS. 6a, 6b, and 7. A state machine 912 supplies a logic functions to the flash memory device 900 because some components only run during certain logic states. This means that when there is a high state, some components are on while others are off and visa versa for a low state.

A data flow control unit 914 controls many major functions of the flash memory device 900. The erasing component 106 of FIG. 1 commonly integrates with the data flow control unit 914. In addition to erasing, the data flow control unit 914 controls reading and writing to the memory array 906, as well as several of the functions performed by components of the subject specification.

Figure 10:
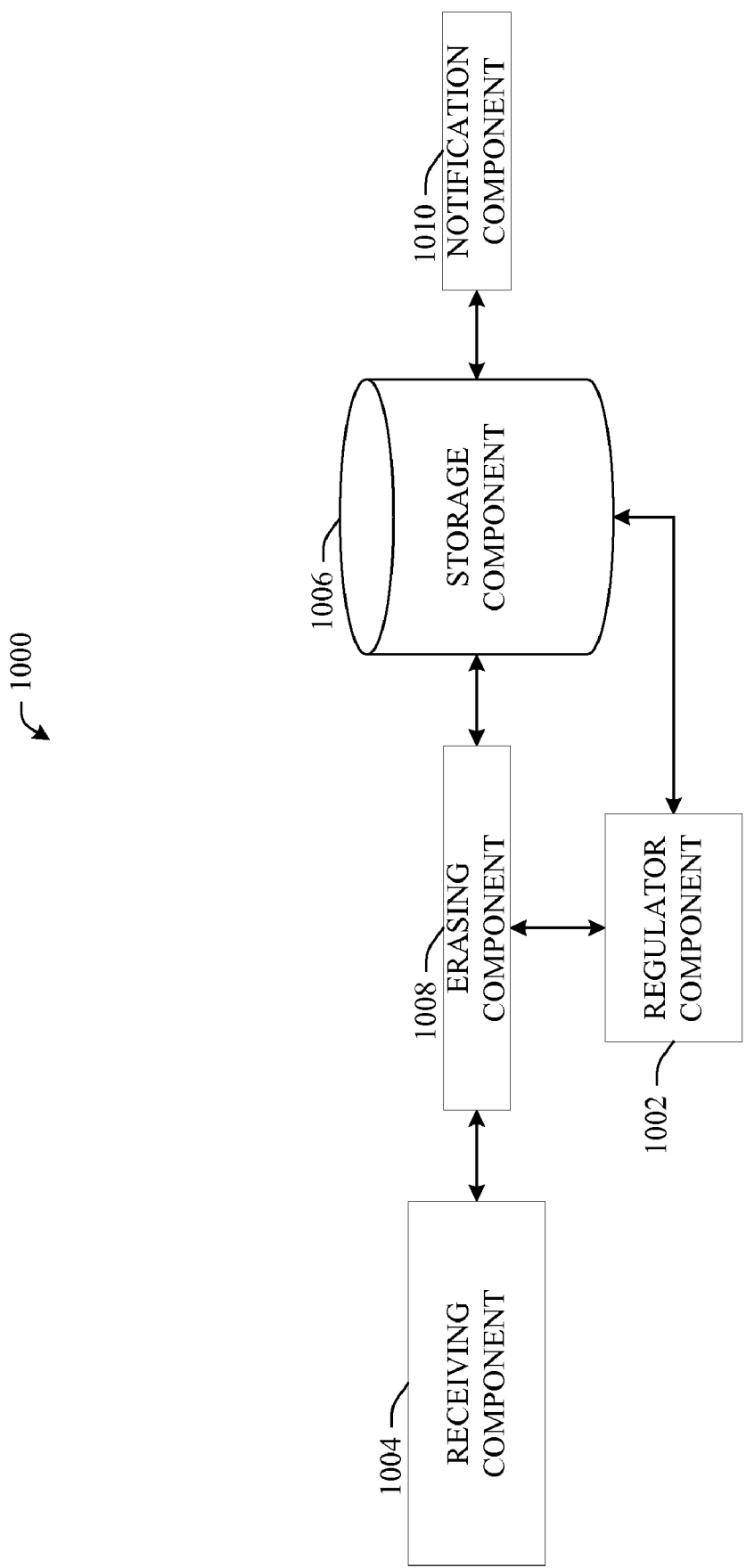
FIG. 10 illustrates a representative flash memory device integrated with a regulator component in accordance with an aspect of the subject specification.

FIG. 10 discloses a flash memory device 1000 with a regulator component 1002. A receiving component 1004 receives a command from a host system to erase information from a storage component 1006. The receiving component 1004 sends a signal to an erasing component 1008 to erase information specified by the host system. The receiving component 1004 can be configured to notify the host system that the request has been successfully received.

The erasing component 1008 performs a check with a regulator component 1002. The regulator component 1002 performs a check with the storage component as to where the specific information that is to be deleted is stored. Based on check results, the regulator component 1002 creates an appropriate erasing sequence. The erasing component 1008 can implement an erasing sequence created by the regulator component 1002.

For example, wordlines the storage component 1006 are spaced 8 nm apart. However, information that is designated for erasing is located on wordlines 1, 2, 7, 12, and 16, where wordlines 1 and 16 border a contact. The regulator component 1002 can identify this and create a sequence so lines erase without influencing one another. The regulator component 1002 can be configured to determine a best erasing sequence (e.g., the lowest number of phases to erase successfully the information without influencing neighboring wordlines). The regulator component 1002 can also configure to create a sequence in accordance with erasing bitlines as well as wordlines.

The erasing component 1008 applies a voltage to wordlines and bitlines that are part of the storage component 1006. However, voltage is applied to only some of the wordlines at one time. The wordlines erased should be far enough apart from one another so that magnetic fields generated by a voltage application do not interfere with erasing other wordlines. In addition to erasing wordlines, the erasing component 1008 also erases bitlines of the storage component 1006. A notification component 1110 processes information about events within the flash memory device 1000.

Figure 11:
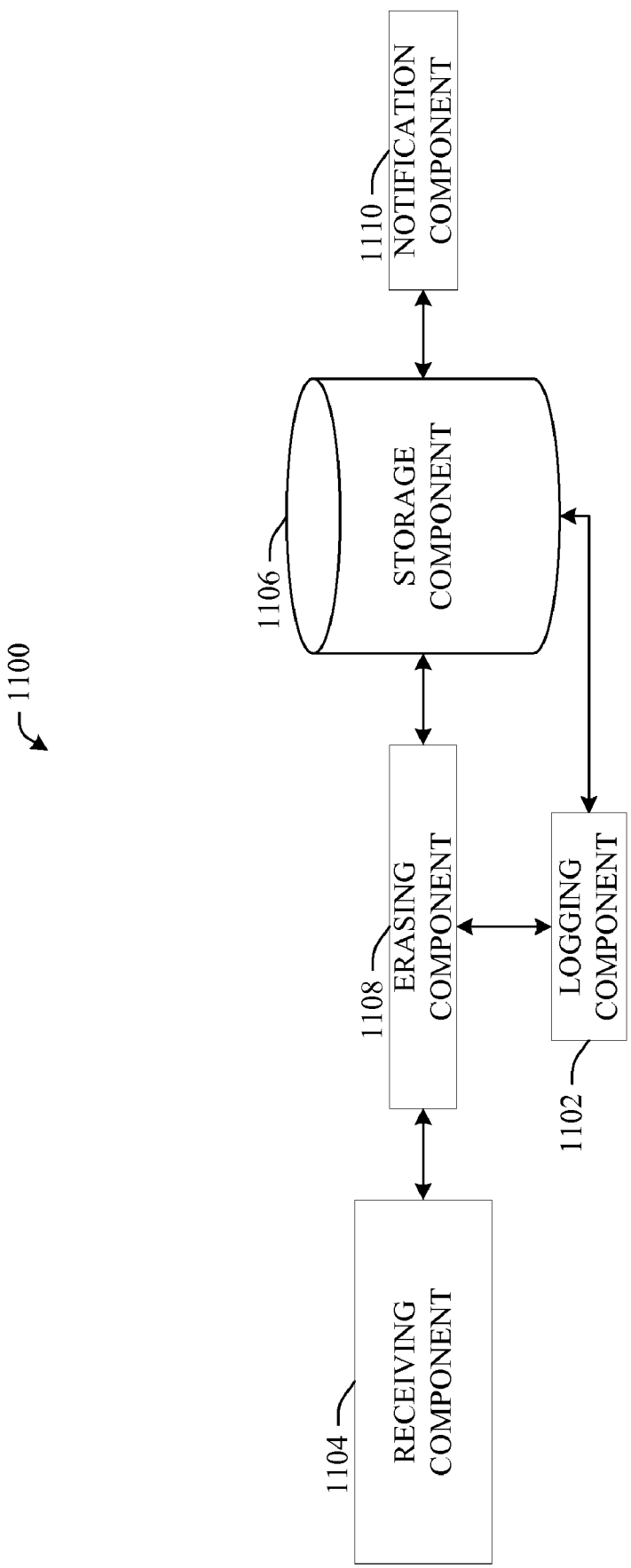
FIG. 11 illustrates a representative flash memory device with a logging component in accordance with an aspect of the subject specification.

FIG. 11 discloses an example flash memory device 1100 with a logging component 1102. A receiving component 1104 obtains a request from a host device to delete information in a storage component 1106. The receiving component 1104 transfers the request to the erasing component 1108. The erasing component deletes information stored in the storage component 1106, commonly by using a pre-determined sequence stored in the erasing component 1008.

The logging component 1002 can make a record (e.g., a log entry) each time a specific wordline is erased. When the flash memory device 1100 wants to store information to the storage component 1106, it can consult the logging component to determine which wordlines to use. The logging component 1102 can suggest wordlines that have been erased the fewest amount of times. Since durability of a wordline is tied to a number of times it erases, it can be beneficial to erase each wordline as few times as possible. A notification component 1110 processes information about the flash memory device 1100. For example, each time a log entry is created by the logging component 1102, the notification component 1110 can sent a record to the host system that the host system can track.

Figure 12:
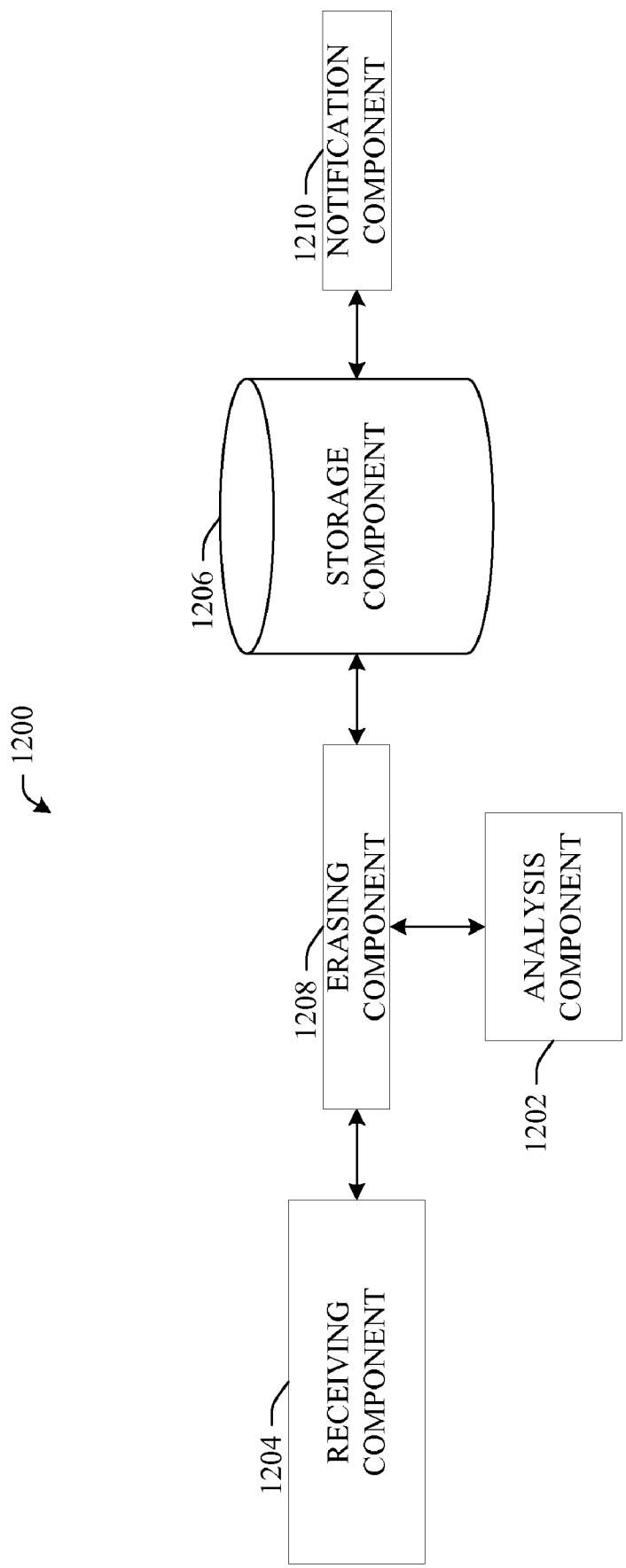
FIG. 12 illustrates a representative flash memory device integrated with an analysis component in accordance with an aspect of the subject specification.

FIG. 12 discloses an example flash memory device 1200 with an analysis component 1202. A receiving component 1204 receives an instruction from a host system to delete information stored in a storage component 1206. On occasion, the instruction can contain specific information on how the information should be deleted. For example, the instruction could contain information that information stored in the storage component 1206 should be deleted using every other wordline (e.g., that all the odd wordlines should be erased, then all of the even wordlines). This command transfers to an erasing component 1208.

The erasing component 1208 consults the analysis component 1202. The analysis component 1202 determines if a progression form the instruction is appropriate. For example, the instruction can state wordlines should be erased every other wordline. However, the wordlines can be spaced too closely together to for erasing every other wordline to have no effect on neighboring wordlines. Therefore, the analysis component 1202 can communicate to the erasing component 1208 that a provided progression should not be used. The erasing component 1208 erases the information in the storage component 1206 based on a communication from the analysis component 1202. A notification component 1210 can send a communication to the host system that the progression contained in the request was not used.

Figure 13A:
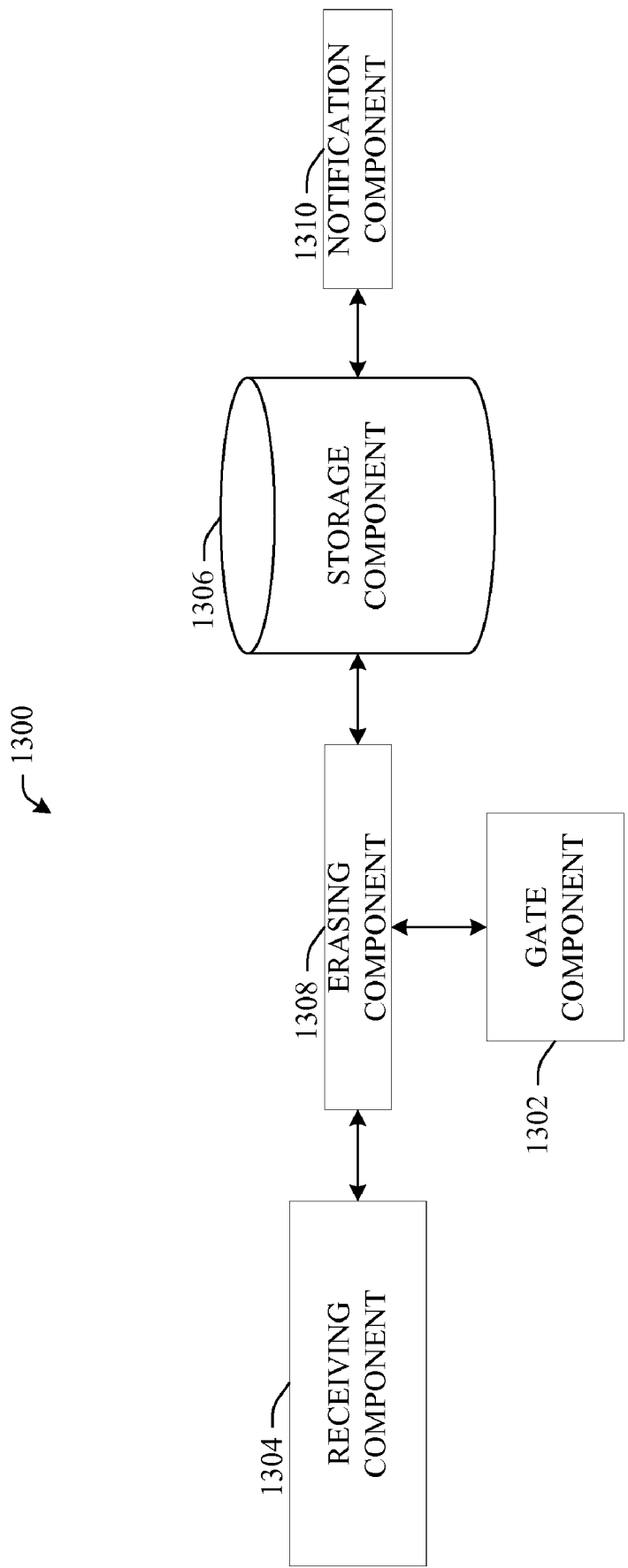
FIG. 13a illustrates a representative flash memory device integrated with a gate component in accordance with an aspect of the subject specification.

FIG. 13a discloses a flash memory device 1300 with a gate component. A receiving component 1304 receives a command from a host system to erase information from a storage component 1306. The receiving component 1304 transfers the instruction to the erasing component 1308. The erasing component 1308 makes a check with the gate component 1302. The gate component 1302 instructs the erasing component 1308 when to commence erasing each wordline that contains information to be erased. In essence, this is instructing when each phase of a sequence should begin. Wordlines can be erased at the same time, so long as they begin at different times so wordline electromagnetic fields do not interfere with one another. A sequence where wordline erases start at different times is considered a multi-stage sequence. The erasing component 1308 erases the appropriate information in the storage component 1306 according a multi-phase erase sequence provided by the gate component 1302. A notification component 1310 can send notification about erasing information.

Figure 13B:
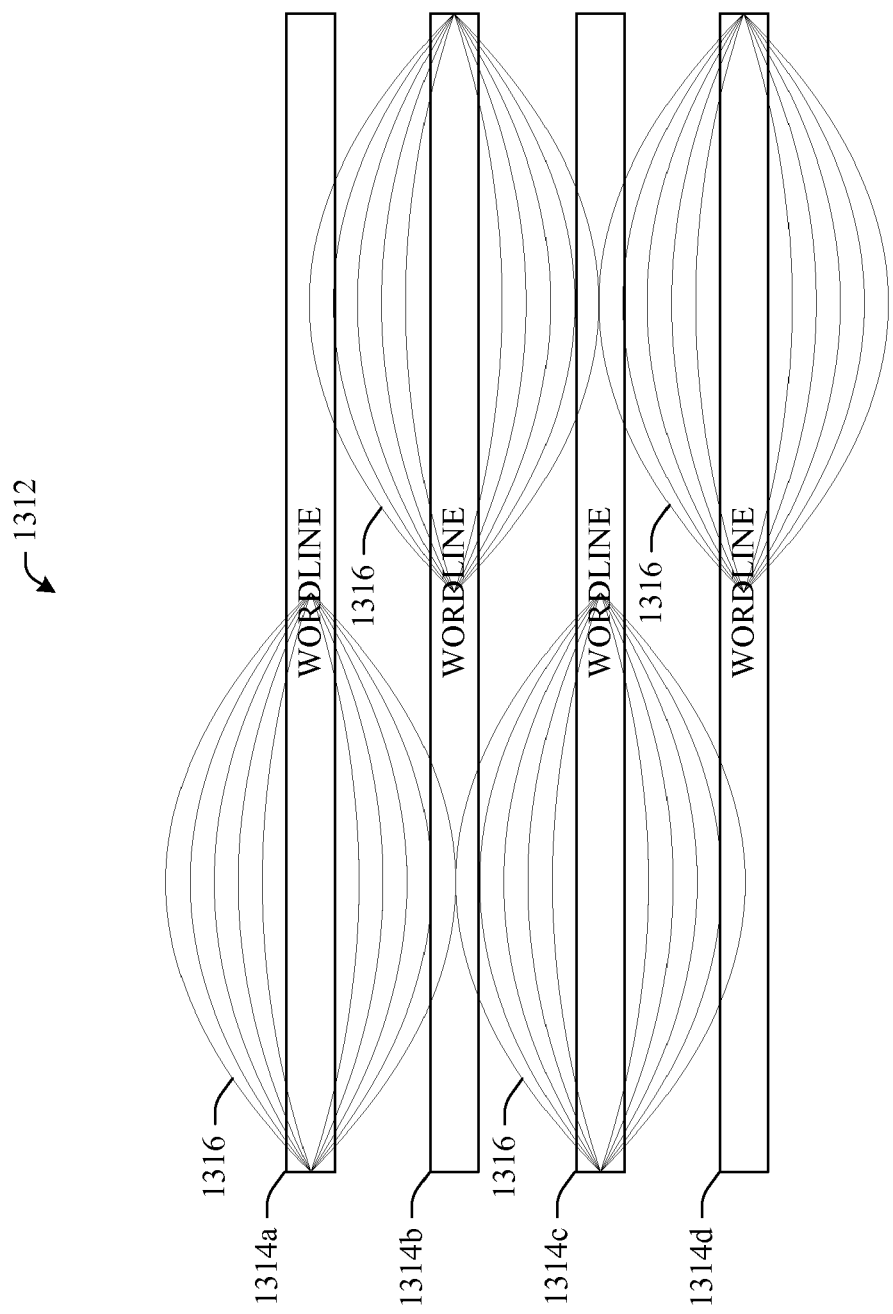
FIG. 13b illustrates a representative wordline configuration with appropriate electromagnetic fields in accordance with an aspect of the subject specification.

FIG. 13b discloses a wordline configuration 1312 in accordance with the operation of the gate component 1302 of FIG. 13a. Four wordlines 1314a-d are arranged in parallel. For example, the wordlines can be separated by less then about 65 nm. Two wordlines 1314b, 1314d can have a voltage that was applied to them. An electromagnetic field passes down the wordline. Voltage can then be applied to wordlines 1314a, 1314c so all wordlines are being erased at the same time. However, the electromagnetic fields 1316 do not interfere with other wordlines while a portion of a wordline is being erased. The parts of non-erase wordlines 1314a, 1314c are not yet being erased when the electromagnetic fields 1316 of erase wordlines 1314b, 1314d pass. In addition, the electromagnetic fields 1316 of erase wordlines 1314a, 1314c pass over non-erase wordlines 1314a, 1314c after the portions of those wordlines have already been erased. This allows for faster erase times without interference from other wordline electromagnetic fields 1316.

Figure 14:
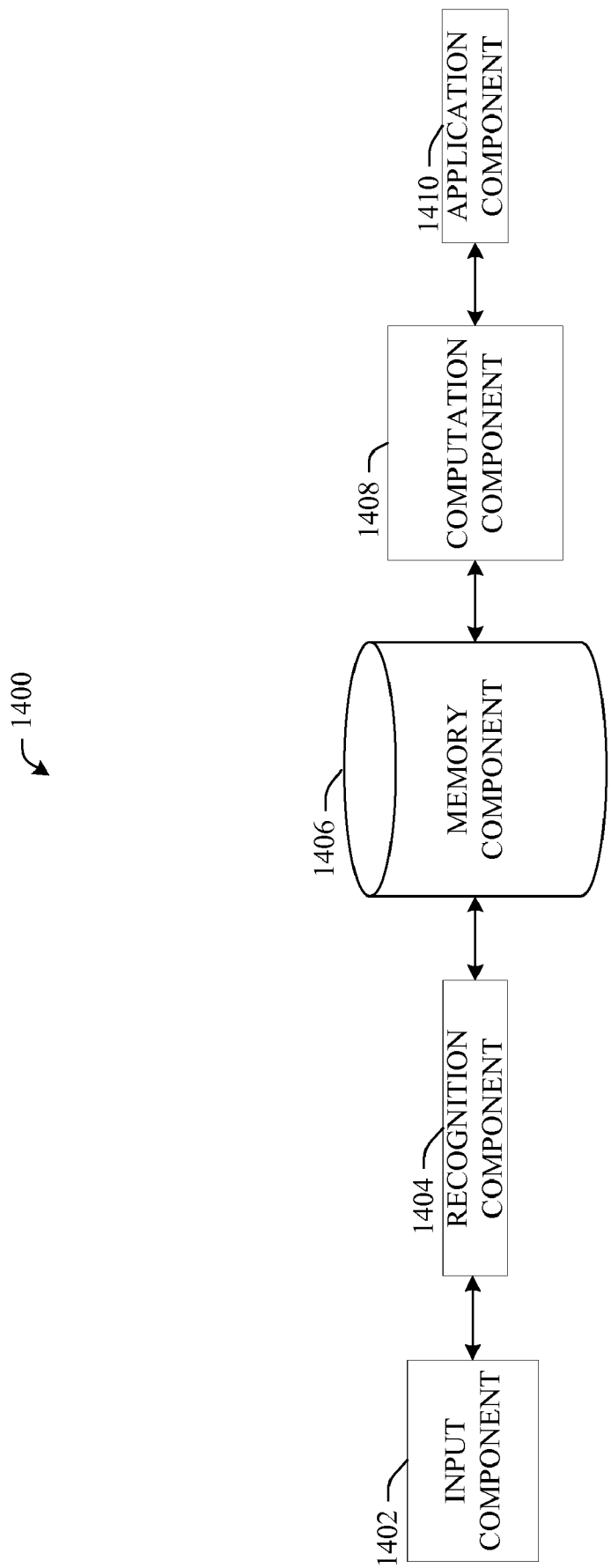
FIG. 14 illustrates a representative erasing component in accordance with an aspect of the subject specification.

FIG. 14 discloses an example erasing component 1400 in accordance with various aspects of the subject specification. Components of the erasing component 1400 can be implemented with other erasing components disclosed in the subject specification. In addition, components shown in the erasing component 1400 do not necessarily integrate in the erasing component and can function as independent components. An input component 1402 receives a command that specific information should be deleted from a storage component. A recognition component 1404 determines what specific requirements are present in the command. A signal travels to a memory component 1406 that looks up an appropriate multi-phase sequence it contains for erasing wordlines. Since the space between wordlines is commonly a fixed number, it is possible to store appropriate sequences in the memory component 1406. A computation component 1408 calculates the bitlines that should be erased during each phase of an erase sequence. The computation component 1408 can also contain logic that allows the erasing component 1400 to select an appropriate sequence, which can be the sequence found in the memory component 1406 or from other components disclosed in the subject specification. An application component applies voltage to wordlines and bitlines in accordance to the multi-stage sequence.

Figure 15:
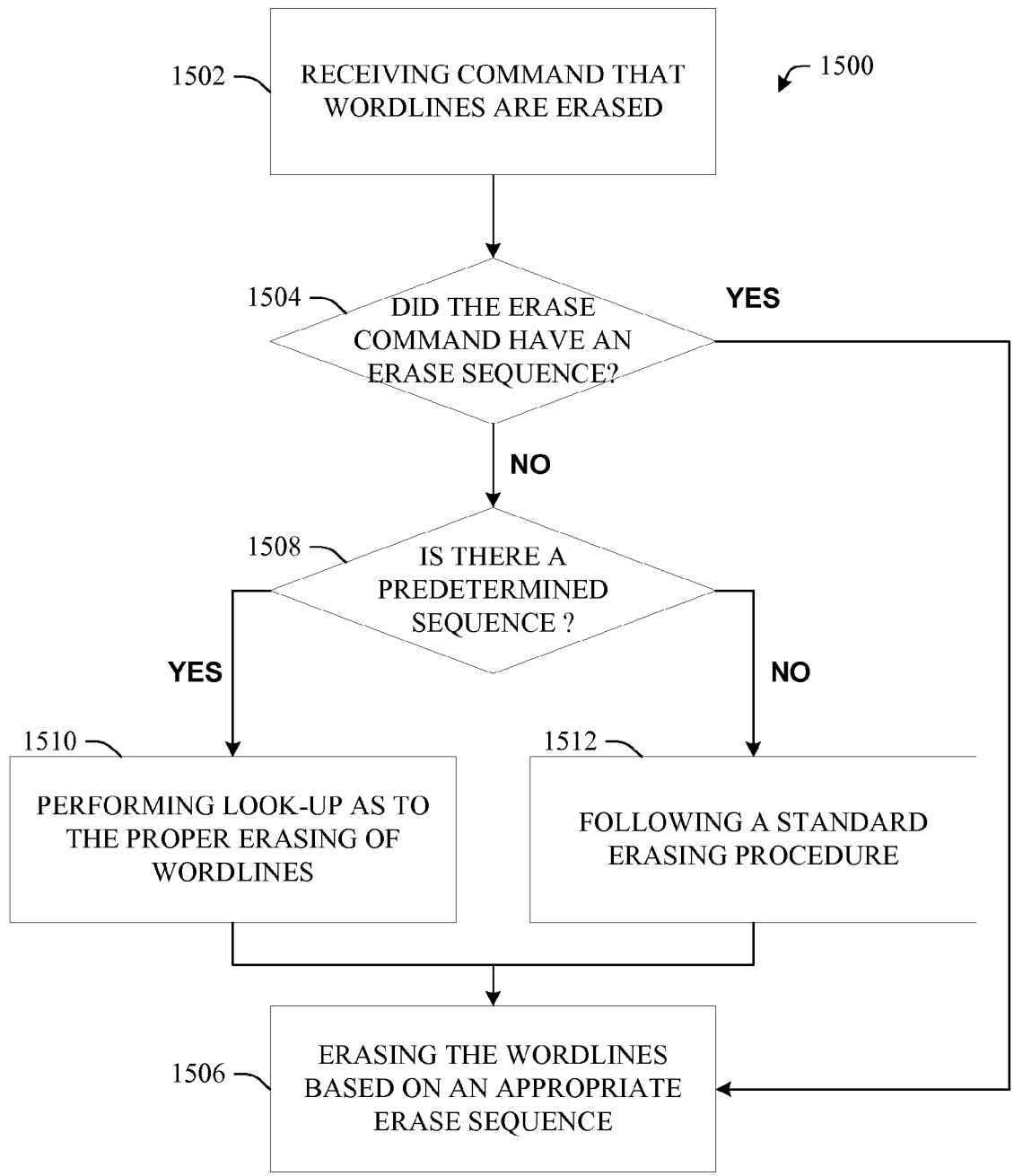
FIG. 15 illustrates a representative methodology in accordance with an aspect of the subject specification.

FIG. 15 discloses a methodology 1500 in accordance with aspects disclosed in the subject specification. In a common implementation of the methodology, a memory array contains information. To erase this information, an erasing component specifically erases a set of wordline that contain the information. In order to do this erasing, a flash memory device receives a command that a specific set of wordlines are to be erased 1502.

The command to erase a set of wordlines can take place in a number of different forms. In one embodiment of the subject specification, a command travels from a host system. For example, a flash memory device capable of carrying out the methodology connects to a personal digital assistant. A user on the personal digital assistant can instruct for the deletion of information in the memory unit. For example, this can be a specific deletion (e.g., delete the information in memory array bank A), a file deletion (e.g., delete the file ABC.xyz), or a total deletion (e.g., delete all information contained in the flash memory device).

In another embodiment of the subject specification, the command arises from an internal component. A flash memory device can have a configuration that allows for a command to delete information to be sent from inside the flash memory device. A component can have a management system that erases information after a meeting of certain criteria. For example, there are times information has not been accessed over a specific length of time (e.g., nine months). In these cases, the flash memory device can automatically initiate deletion of information off the flash memory device. In a further embodiment, the initiation can take place at different times for different files. For example, .zip files are deleted if not accessed for twelve months while all other filed are deleted if not accessed for six months.

A command can contain a sequence in which to erase any necessary wordlines and the methodology can check this command 1504. For example, a command can instruct a flash memory device to delete wordlines in a specific order (e.g., delete odd numbered wordlines first and once complete delete all even numbered wordlines). In one embodiment of the subject specification, when the command contains a specific sequence, the methodology 1500 continues to erase the wordlines according to the prescribed sequence 1506. In this embodiment, if there is no sequence present in an erase command, there is a check if an erasing component has a specific erase sequence to follow.

In the previous embodiment, the command sequence can be labeled as the dominant sequence, since it is followed regardless of a pre-set sequence embedded in the flash memory device. In another embodiment of the subject specification, a pre-set sequence can be a dominant sequence. This means that regardless of any sequence request by an erase command, the erase sequence used is the one pre-set in the flash memory device. This could eliminate a check at 1504 or the check 1504 could still take place for administrative purposes. One reason for doing this is the distance between wordlines is likely not going to change after manufacturing and the pre-set command will be in a better position to allow for a uniform erasing of a memory array. This is especially true for a command sequence coming from outside a flash memory device, since the device producing the command will likely not know the distance between the wordlines inside the flash memory device.

In a further embodiment of the subject specification, the erasing sequence can follow a hybrid between a command provided sequence and a pre-set sequence. In one configuration, the pre-set sequence can be a minimum sequence, which a command sequence can override if it is equal to or if it surpasses the minimum. For example, a pre-set sequence can set a minimum standard of erasing at least every other line (e.g., odd lines first, even lines second). A command sequence that requests erasing of wordlines at every fourth is authorized. The reason for this is the electromagnetic fields emitted at every fourth will not affect the erasing uniformity any differently then erasing every other line. However, a command that request all wordlines to erase at once will not be followed because it falls below the minimum and would disrupt the erasing uniformity because the electromagnetic fields produced during erasing lead to uneven distribution of erasing.

Using the methodology, when a command sequence is primary, yet there is no command sequence and there is a predetermined sequence, action 1508 takes place. If there is a pre-set sequence, then the methodology looks up what sequence to use 1510. It is possible that the erasing of different information can produce different electromagnetic fields. Because of this, a look-up table can be used to determine what sequence to follow. The result of this look-up becomes the erasing sequence that takes place in erasing any desired wordlines.

If there is no erasing sequence present in the flash memory device, then the system erased the wordlines in a standard procedure 1512. For example, the standard procedure can be erasing the wordlines all at once or erasing wordlines one by one where the commencement of erasing another wordline does not take place until the completion of erasing of an immediately previous wordline. Based on the standard procedure, the wordlines erase in a sequence conforming to this procedure.

Figure 16A:
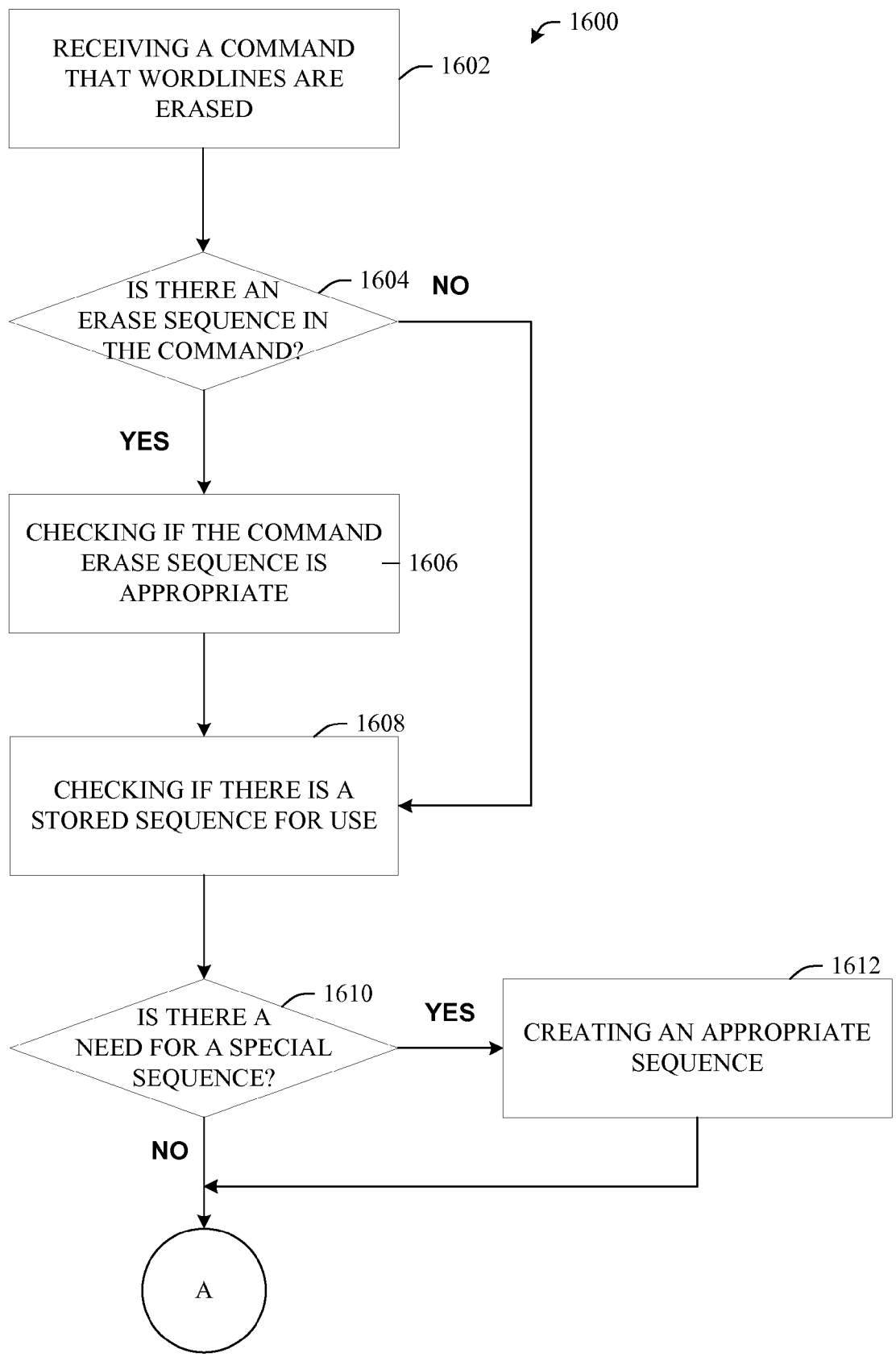
FIG. 16a illustrates a first part of a representative methodology in accordance with an aspect of the subject specification.
Figure 16B:
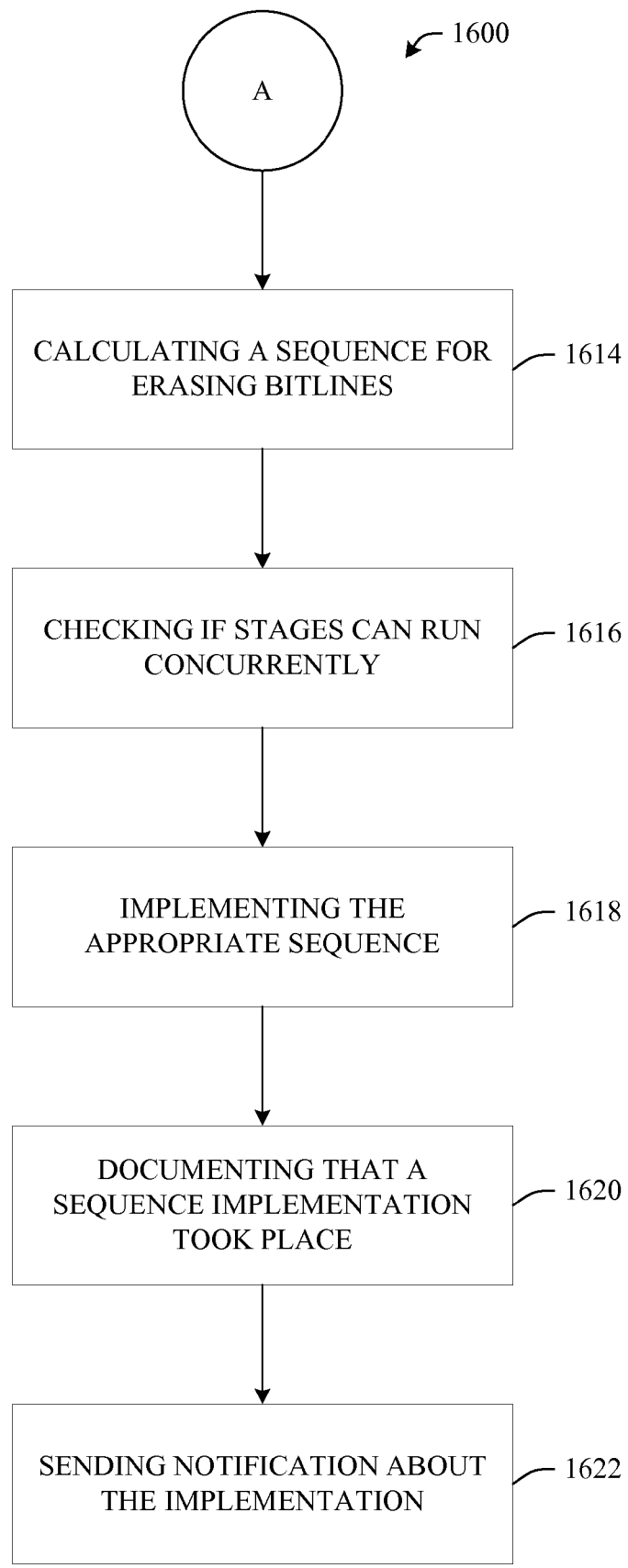
FIG. 16b illustrates a second part of a representative methodology in accordance with an aspect of the subject specification.

FIG. 16a-b discloses an example methodology in accordance with an aspect of the subject specification. A flash memory device receives a command that specific information in a storage component should be erased 1602. There are occasions when the command contains a specific erase sequence that should be used when erasing the data. Therefore, there should be a check to determine if any sequence is in the command 1604. If there is a command, then a check takes place to determine if the command is appropriate 1606. For instance, it is possible the command requests to erase all wordlines at once despite the fact that the wordlines are spaced together closer then 65 nm. A command in this situation can be deemed inappropriate. Once a check of appropriateness takes place or there is no erase sequence in the command, the methodology continues to action 1608.

At event 1610 a check takes place if there needs to be a special progression. There are instances when a command requests to erase only part of a wordline set. However, the wordlines that need to be erased could be scattered throughout several wordline sets. Therefore, a special sequence can be created to allow for the fastest erase speed 1612. Regardless of need of a special sequence, the methodology continues to event 1614. In addition to deleting information off wordlines, information can be deleted off bitlines that also contain information. A selection is made as to what bitlines should be erased during each phase of a sequence 1614.

A check is also performed to determine if stages of a sequence can run concurrently 1616. For example, a second stage can begin whit a first stage is taking place in some situations. An appropriate sequence is implemented 1618. The appropriate sequence can be any sequence determined by other actions of the methodology 1600. In addition, the sequence commonly contains information about deleting both bitlines and wordlines. However, it is possible for the multi-state sequence to be the same as an obtained multi-phase sequence for erasing wordlines. A log entry can be made about any erasing that takes place 1620. In addition, notice can be sent 1622 to another device providing information about the methodology 1600.

What is described above includes examples of the present specification. It is, of course, not possible to describe every conceivable combination of components or methodologies for purposes of describing the present specification, but one of ordinary skill in the art may recognize that many further combinations and permutations of the present specification are possible. Accordingly, the present specification is intended to embrace all such alterations, modifications and variations that fall within the spirit and scope of the appended claims. Furthermore, to the extent that the term "includes" is used in either the detailed description or the claims, such term is intended to be inclusive in a manner similar to the term "comprising" as "comprising" is interpreted when employed as a transitional word in a claim.

What is claimed is:

1. A system, comprising:
    a storage component that includes a plurality of wordlines that store information;
    a receiving component that receives a command to erase information stored in the storage component; and
    an erasing component that erases information stored on the plurality of wordlines in a sequence of at least two phases, wherein each phase of the sequence includes a subset of the plurality of wordlines, and wherein the sequence is based at least in part on location or spacing of the plurality of wordlines in the storage component, and the sequence is further based at least in part upon: a new sequence responding to the command, a predetermined sequence from a look-up table, or a sequence included as part of the command.

2. The system of claim 1, further comprising a regulator component that creates the sequence for use by the erasing component.

3. The system of claim 1, further comprising a logging component that creates a record of erasing component operation.

4. The system of claim 1, further comprising an analysis component that determines whether the erasing component uses a sequence included with the command.

5. The system of claim 1, further comprising a gate component that commences starting time of at least one phase.

6. The system of claim 1, further comprising a notification component that sends a message about the erasing component to an external device or to a diagnostic component within the system.

7. The system of claim 1, wherein the erasing component comprises a memory component that includes the sequence for erasing information stored on the plurality of wordlines.

8. The system of claim 1, further comprising a computation component that calculates how many bitlines should be erased from a plurality of bitlines during each phase.

9. The system of claim 8, wherein the erasing component erases information stored on a number of bitlines during each phase wherein erased bitlines for each phase are calculated by the computation component.

10. The system of claim 1, wherein the sequence is determined based upon proximity of a wordline to a contact in the storage component.

11. The system of claim 1, wherein the sequence is determined based upon spatial distance between neighboring wordlines.

12. A method, comprising:
    receiving a command to erase information stored in wordlines of a flash memory device;
    obtaining a multi-stage sequence for erasing wordlines based on location and spacing of the wordlines within the flash memory device, wherein a stage includes one or more wordlines and the multi-stage sequence includes at least one of: a multi-stage sequence created in response to the command, a pre-set multi-stage sequence from a look-up table, or a multi-stage sequence that is based at least in part on an erase sequence included in the command; and
    implementing the multi-stage sequence for erasing wordlines.

13. The method of claim 12, further comprising calculating bitlines to erase for at least one state of the multi-stage sequence.

14. The method of claim 13, wherein implementing a multi-stage sequence comprises erasing calculated bitlines.

15. The method of claim 12, further comprising making a documentation of implementing the multi-stage sequence.

16. The method of claim 12, further comprising determining whether to implement an obtained multi-stage sequence based at least in part on an erase sequence included in the command.

17. The method of claim 12, further comprising distributing a correspondence about implementing the multi-stage sequence.

18. The method of claim 12, wherein implementing the multi-stage sequence includes starting a second stage before completion of a first stage.

19. The method of claim 12, wherein the multi-stage sequence is obtained from a component that creates a multi-stage sequence.

20. A system, comprising:
    means for holding information in a plurality of bitlines and a plurality of wordlines;

means for receiving a command to erase information held on the plurality of bitlines and the plurality of wordlines; and means for expunging information held on the plurality of wordlines and the plurality of bitlines through a multi-stage progression, the multi-stage progression is based at least in part on the distance between adjacent wordlines from the plurality of wordlines and is at least one of: created for the command, a pre-set sequence, progression information included in the command, or a hybrid comprising a pre-set sequence and progression information included in the command.

* * * * *